United States Patent [19]

Hitotsuyanagi et al.

[11] Patent Number: 4,612,559
[45] Date of Patent: Sep. 16, 1986

[54] SOLAR CELL OF AMORPHOUS SILICON

[75] Inventors: Hajime Hitotsuyanagi; Tadashi Igarashi; Masayuki Ishii; Tadakazu Kobayashi, all of Itami, Japan

[73] Assignee: Director General of Agency of Industrial Science & Technology, Tokyo, Japan

[21] Appl. No.: 587,702

[22] Filed: Mar. 8, 1984

[30] Foreign Application Priority Data

Mar. 8, 1983 [JP] Japan .................................. 58-36751
Mar. 8, 1983 [JP] Japan .................................. 58-36752

[51] Int. Cl.<sup>4</sup> ........................................... H01L 45/00
[52] U.S. Cl. ......................................... 357/2; 357/30; 357/63; 357/58; 357/4
[58] Field of Search ...................... 357/2, 30, 4, 63, 58

[56] References Cited

U.S. PATENT DOCUMENTS

| 4,342,044 | 7/1982 | Ovshinsky | 357/2 |
| 4,396,793 | 8/1983 | Madan | 357/2 X |
| 4,407,710 | 10/1983 | Moustakas | 357/2 X |
| 4,460,670 | 7/1984 | Ogawa | 357/2 X |
| 4,492,810 | 1/1985 | Ovshinsky | 357/2 X |

Primary Examiner—Martin H. Edlow
Attorney, Agent, or Firm—Wenderoth, Lind & Ponack

[57] ABSTRACT

A PIN solar cell of amorphous silicon with a high photovoltaic conversion efficiency is provided, in which in the P type layer, the electric conductivity of a zone in contact with an electrode is higher than that of another zone in contact with the I type layer.

11 Claims, 2 Drawing Figures

SOLAR CELL OF AMORPHOUS SILICON

BACKGROUND OF THE INVENTION

1. Field of the Invention

This invention relates to a solar cell of amorphous silicon capable of converting solar radiation into electrical energy.

2. Description of Prior Art

Of late, solar cells of amorphous silicon have been watched as a low cost solar cell capable of utilizing clean and inexhaustible energy. Solar cells of amorphous silicon have a feature that the cost of production thereof is low because of being made up of a low-priced substrate and a thin film of less than 1 μm in thickness, formed by a low temperature process. In order to make the best use of this feature of low cost, it is necessary to raise the photovoltaic conversion efficiency of an amorphous silicon solar cell so that it can be put to practical use.

Various proposals have hitherto been made to improve the performances of a solar cell using amorphous silicon. Many of solar cells of PIN structure are so constructed that a P type layer is provided at the illumination side so as to collect readily holes with a shorter diffusion length of pairs of electron-hole formed in high density by solar radiation and to raise the comprehensive collection efficiency of solar radiation.

However, a P type layer containing a Group IIIb element of Periodic Table such as boron (B) exhibiting P type has generally such a large light absorption coefficient that a lot of photons cannot be fed to an I layer where carriers are formed. Therefore, in a PIN structure in which a P type layer is arranged at the illumination side, amorphous silicon to which carbon or nitrogen with a larger forbidden band gap is added (a-Si:C:H or a-Si:N:H) is used for the P type layer to utilize effectively lights of short wavelengths. Furthermore, if the fill factor is improved, the photovoltaic conversion efficiency can further be increased. In this case, it can be expected to improve the series resistance of a solar cell, to improve the fill factor and to raise the photovoltaic conversion efficiency by decreasing the electric resistance of an interface between a P type layer and electrode layer.

U.S. Pat. No. 4,064,521 describes one example of a PIN solar cell including a body of amorphous silicon comprising a P type first layer doped with boron, an intrinsic layer and N type second layer doped with phosphorus, but in this case, the P type layer in contact with a transmissive electrode is uniformly doped. Thus, this solar cell has an insufficient photovoltaic efficiency.

SUMMARY OF THE INVENTION

It is an object of the present invention to provide a solar cell of amorphous silicon with a high efficiency in conversion of solar radiation into usable electric energy.

It is another object of the present invention to provide a PIN solar cell of a novel structure having a higher sensitivity to light and a lower series resistance.

These objects can be attained by a PIN solar cell of amorphous silicon, characterized in that in the P type layer, the electric conductivity of a zone in contact with an electrode is higher than that of another zone in contact with the I type layer.

BRIEF DESCRIPTION OF THE DRAWINGS

The accompanying drawings are to illustrate the merits and the principle of the present invention.

DETAILED DESCRIPTION OF THE INVENTION

The inventors have found as a result of various studies that in a PIN junction structure solar cell having a P type layer at the incident side, the electric conductivity of a zone of the P type layer, in contact with an electrode, is made higher than that of another zone in contact with the I type layer and thus the series resistance of the solar cell is decreased to improve the fill factor and to raise the photoelectric conversion efficiency, and reached the present invention.

Noticing that the film property can be controlled within a wide range by varying the composition or producing conditions of P type a-Si:C:H film or a-Si:N:H film, the inventors have further made studies and consequently, have found that the electric conductivity of a zone of P type a-Si:C:H film or a-Si:N:H film, in contact with an electrode, is made higher than that of another zone in contact with the I type layer and thus the series resistance of the solar cell is decreased to improve the fill factor and to increase the photoelectric conversion efficiency.

Figure 1:
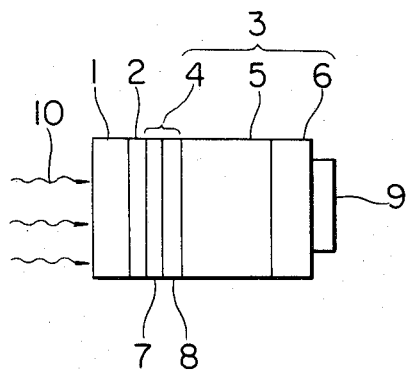
FIG. 1 is a cross-sectional view of an embodiment of the solar cell of the present invention.

The present invention will now be illustrated by preferred embodiments:

FIG. 1 is a cross-sectional view of one embodiment of an a-Si solar cell according to the present invention, comprising transparent glass substrate 1, transparent and electrically conductive film 2, amorphous silicon layer 3 whose conductivity type is composed of P type 4, I type 5 and N type 6 from the substrate side and metal electrode 9. P type layer 4 consists of two layers $P_1$ 7 and $P_2$ 8 differing in the quantity of carbon or nitrogen, $P_1$ layer 7 having a quantity of carbon or nitrogen less than $P_2$ layer 8. The thickness of $P_1$ layer, $P_2$ layer, I type layer and N type layer are respectively 80 Å, 150 Å, 5000 Å and 500 Å. Metal electrode 9 is of aluminum and has a thickness of 5000 Å. 10 is incident solar radiation.

In another embodiment, P type layer 4 consists of $P_1$ layer 7 and $P_2$ layer 8 containing carbon or nitrogen and different quantities of a Group IIIb element of Periodic Table such a boron or aluminum. The quantity of a Group IIIb element of Periodic Table in $P_1$ layer 7 near the substrate is larger than that in $P_2$ layer 8.

Figure 2:
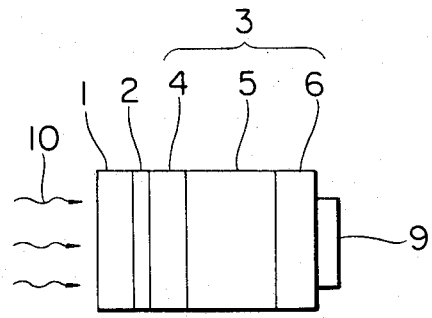
FIG. 2 is a cross-sectional view of the solar cell of the prior art.

FIG. 2 is a cross-sectional view of the prior art solar cell containing a P type layer consisting of one layer.

In Table 1 are shown the output properties of a solar cell using an amorphous silicon layer containing a P type layer to which carbon is added, and in Table 2 are shown the output properties of another solar cell using an amorphous silicon layer containing a P type layer to which nitrogen is added. As is evident from these results, in the case of adding carbon or nitrogen in a lower concentration to a zone of the P type layer, in contact with an electrode, than to a zone in contact with the I type layer, the fill factor is markedly improved and the photovoltaic conversion efficiency can be increased.

TABLE 1

|  | Photovoltaic Conversion Efficiency (%) | Short-circuit Current Density (mA/cm$^2$) | Open Circuit Voltage (V) | Fill Factor (%) | Composition of P layer | |
|---|---|---|---|---|---|---|
|  |  |  |  |  | $P_1$ | $P_2$ |
| Comparative Example 1 | 6.6 | 12.9 | 0.85 | 60 | $Si_{0.7}C_{0.3}$ | |
| Comparative Example 2 | 7.3 | 14.3 | 0.89 | 57 | $Si_{0.5}C_{0.5}$ | |
| Example 1 | 7.2 | 12.6 | 0.85 | 67 | $Si_{0.9}C_{0.1}$ | $Si_{0.7}C_{0.3}$ |
| Example 2 | 8.0 | 13.7 | 0.90 | 65 | $Si_{0.75}C_{0.25}$ | $Si_{0.5}C_{0.5}$ |

(irradiated light: AM-1 (100 mW/cm$^2$))

TABLE 2

|  | Photovoltaic Conversion Efficiency (%) | Short-circuit Current Density (mA/cm$^2$) | Open Circuit Voltage (V) | Fill Factor (%) | Composition of P type layer | |
|---|---|---|---|---|---|---|
|  |  |  |  |  | $P_1$ | $P_2$ |
| Comparative Example 3 | 6.0 | 12.0 | 0.84 | 60 | $Si_{0.7}N_{0.3}$ | |
| Comparative Example 4 | 6.9 | 13.3 | 0.89 | 58 | $Si_{0.5}N_{0.5}$ | |
| Example 3 | 7.2 | 12.9 | 0.84 | 66 | $Si_{0.9}N_{0.1}$ | $Si_{0.7}C_{0.3}$ |
| Example 4 | 7.8 | 13.5 | 0.89 | 65 | $Si_{0.8}N_{0.2}$ | $Si_{0.5}N_{0.5}$ |

(irradiated light: AM-1 (100 mW/cm$^2$))

Generally, carbon is added in a proportion of 0 to 25 atom % to $P_1$ layer and in a proportion of 10 to 50 atom % to $P_2$ layer, and nitrogen is added in a proportion of 0 to 25 atom % to $P_1$ layer and in a proportion of 10 to 50 atom % to $P_2$ layer.

In Table 3 are shown the output properties of a solar cell using an amorphous silicon layer containing a P type layer to which carbon and boron are added, and in Table 4 are shown the output properties of another solar cell using an amorphous silicon layer to which nitrogen and boron are added. Carbon or nitrogen is contained and alloyed in the film in an amount of 30 atom %. As is evident from these results, in the case of adding boron in a higher concentration to a zone contacting with an electrode in the P type layer than to a zone contacting with the I type layer, the fill factor is markedly improved and the photovoltaic conversion efficiency can be increased. Generally, Group IIIb elements are added in a proportion of 10 to 0.1 atom % and 1 to 0.05 atom % respectively to $P_1$ layer and $P_2$ layer.

TABLE 3

|  | Photovoltaic Conversion Efficiency (%) | Short-circuit Current Density (mA/cm$^2$) | Open Circuit Voltage (V) | Fill Factor (%) | Quantity of Boron Added to P type Layer (%) | |
|---|---|---|---|---|---|---|
|  |  |  |  |  | $P_1$ | $P_2$ |
| Comparative Example 5 | 6.5 | 13.3 | 0.88 | 56 | 0.1 | |
| Example 5 | 7.5 | 13.2 | 0.88 | 65 | 0.5 | 0.1 |

(irradiated light: AM-1 (100 mW/cm$^2$))

TABLE 4

|  | Photovoltaic Conversion Efficiency (%) | Short-circuit Current Density (mA/cm$^2$) | Open Circuit Voltage (V) | Fill Factor (%) | Quantity of Boron Added to P type Layer (%) | |
|---|---|---|---|---|---|---|
|  |  |  |  |  | $P_1$ | $P_2$ |
| Comparative Example 6 | 6.2 | 13.2 | 0.87 | 55 | 0.1 | |
| Example 6 | 7.3 | 13.0 | 0.87 | 65 | 0.5 | 0.1 |

(irradiated light: AM-1 (100 mW/cm$^2$))

Addition of at least one of carbon and nitrogen to a P type layer is to improve the photovoltaic conversion efficiency by the so-called window effect that the forbidden band gap of the P type layer is enlarged to reduce the absorption of light and more photons are fed to the I type layer where carriers effective for the photovoltaic conversion are formed.

The forbidden band gap can be enlarged by increasing the quantity of carbon or boron and the absorption of light in the P type layer can be decreased. With the increase of the quantity of carbon or nitrogen, however, the electric conductivity of the P type layer is lowered and in particular, the series resistance of the solar cell based on the electric resistance at the joint surface between the P type layer and electrode is increased.

In order to decrease the series resistance of the solar cell based on the electric resistance at the joint surface between the P type layer and electrode, the quantity of a Group IIIb element of Periodic Table such as boron or aluminum can be increased. However, with the increase of the quantity of a Group IIIb element of Periodic Table such as boron or aluminum, the forbidden band gap is narrowed and the absorption of light in the P type layer is increased.

In any case, the photovoltaic conversion efficiency is lowered. Lowering of the electric conductivity of a zone contacting with an electrode in the P type to be less than that of a zone contacting with the I type layer is carried out by dividing the P type layer into a $P_1$ layer which has a relatively narrow forbidden band gap but a higher electric conductivity and which is suitable for joint with an electrode, and a $P_2$ layer which has a wide forbidden band gap and less absorption of light, for the purpose of overcoming the above described disadvantage.

The $P_1$ layer has preferably a thickness of 50 to 150 Å, since if the thickness is less than 50 Å, it is impossible to obtain a uniform $P_1$ layer and a desirable and good joint effect with an electrode, while if more than 150 Å, the absorption of light in the $P_1$ layer is so large that the window effect be deteriorated. The $P_2$ layer has preferably a film thickness of 50 to 300 Å, since if the film thickness is less than 50 Å, a uniform $P_2$ layer cannot be formed, while if it is more than 300 Å, the absorption of light becomes so large that the window effect would be deteriorated.

In the above described embodiments of the present invention, only the P type layer consisting of two layers of a $P_1$ layer with a high electric conductivity and a $P_2$ layer with a wide forbidden band gap is illustrated, but if necessary, three or more layers can be provided. In addition, the quantity of carbon or nitrogen can continuously be varied in such a manner that the electric conductivity of a zone in contact with an electrode in the P type layer is higher than that of a zone in contact with the I type layer. Similarly, the quantity of a Group IIIb element of Periodic Table such as boron or aluminum can also be varied continuously in such a manner that the electric conductivity of a zone in contact with an electrode in the P type layer is made higher than that of a zone in contact with the I type layer.

The present invention does not limit the composition of the I type layer and an amorphous silicon layer not in contact with an electrode in a multi-layer structure but can be adapted to any structures containing a P type layer.

What is claimed is:

1. In a solar cell of amorphous silicon having a PIN structure, wherein the solar radiation is allowed to enter from the P type layer, the improvement comprising the P type layer which consists of laminated layers of a $P_1$ layer and a $P_2$ layer, the $P_1$ layer having a larger electrical conductivity and a lower concentration of carbon or nitrogen than the $P_2$ layer.

2. The solar cell of amorphous silicon of claim 1, in which the P type layer has a continuously varied concentration of carbon or nitrogen.

3. The solar cell of amorphous silicon of claim 1, in which in the P type layer contains at least one element selected from the group consisting of Group IIIb elements of the Periodic Table and is in a higher concentration in a zone in contact with an electrode in contact with the P type layer than in a zone in contact with the I type layer.

4. The solar cell of amorphous silicon of claim 1, in which in the P type layer contains at least one element of carbon and nitrogen and at least one element selected from the group consisting of Group IIIb elements of the Periodic Table and is in a higher concentration in a zone in contact with an electrode in contact with the P type layer than in a zone in contact with the I type layer.

5. The solar cell of amorphous silicon of claim 3, in which the P type layer consists of laminated layers of a $P_1$ layer and a $P_2$ layer, the $P_1$ layer having a higher concentration of Group IIIb element of Periodic Table than the $P_2$ layer.

6. The solar cell of amorphous silicon of claim 1, in which the $P_1$ layer has a thickness of 50 to 150 Å and the $P_2$ layer has a thickness of 50 to 300 Å.

7. The solar cell of amorphous silicon of claim 5, in which the $P_1$ layer has a thickness of 50 to 150 Å and the $P_2$ layer has a thickness of 50 to 300 Å.

8. The solar cell of amorphous silicon of claim 1, in which the P type layer has a continuously varied concentration of Group IIIb element of Periodic Table.

9. The solar cell of amorphous silicon of claim 1, in which the amorphous silicon layer has a conductivity type formed in the order of P type, I type and N type from the substrate side.

10. A solar cell of amorphous silicon comprising a transparent glass substrate, a transparent conductive film, a layer of amorphous silicon having a PIN structure as in claim 1 and a metal electrode connected to the N layer of the PIN structure whereas the $P_1$ layer is in contact with the transparent conductive film and has a larger electrical conductivity than the $P_2$ layer in contact with the I type layer.

11. The solar cell of amorphous silicon of claim 10, in which the $P_1$ layer has a higher concentration of at least one member selected from the group consisting of Group IIIb elements of Periodic Table than the $P_2$ layer.

* * * * *